United States Patent [19]

Fattaruso

[11] Patent Number: 5,451,909
[45] Date of Patent: Sep. 19, 1995

[54] FEEDBACK AMPLIFIER FOR REGULATED CASCODE GAIN ENHANCEMENT

[75] Inventor: John W. Fattaruso, Dallas, Tex.

[73] Assignee: Texas Instruments Incorporated, Dallas, Tex.

[21] Appl. No.: 20,509

[22] Filed: Feb. 22, 1993

[51] Int. Cl.[6] ............................................. H03F 3/04
[52] U.S. Cl. ..................... 330/311; 330/296; 330/85; 330/293; 330/277
[58] Field of Search .............. 330/296, 85, 311, 277, 330/293; 307/554

[56] References Cited

U.S. PATENT DOCUMENTS 4,777,472  10/1988  Sauer et al. ................... 330/311
5,039,954  8/1991   Bult et al. ..................... 330/311

OTHER PUBLICATIONS

Klaas Bult and Govert J. G. M. Geelen, "A Fast-Settling CMOS Op Amp for SC Circuits with 90-dB DC Gain", IEEE Journal of Solid-State Circuits, vol. 25, No. 6, Dec. 1990, pp. 1379–1384.

Eduard Sackinger and Walter Guggenbuhl, "A High-Swing, High-Impedance MOS Cascode Circuit", IEEE Journal of Solid-State Circuits, vol. 25, No. 1, Feb. 1990, pp. 289–297.

*Primary Examiner*—William L. Sikes
*Assistant Examiner*—James A. Dudek
*Attorney, Agent, or Firm*—Peter T. Rutkowski; Richard L. Donaldson; William E. Hiller

[57] ABSTRACT

A regulated cascode circuit with enhanced gain includes a cascode section including a common source MOS transistor ($m_1$) of a first polarity and a cascode device ($m_2$) wherein the drain of the common-source MOS transistor ($m_1$) is coupled to the source of the cascode device. An input to the regulated cascode circuit is applied to the common source MOS transistor ($m_1$) and an output of the regulated cascode circuit is developed at the drain of the cascode device ($m_2$) across both the common source MOS transistor ($m_1$) and cascode ($m_2$) device. A feedback amplifier circuit (10) has its input (12) connected to the drain of the common source MOS transistor ($m_1$) and its output (20) connected to a gate of the cascode device ($m_2$) for driving the cascode device ($m_2$). The feedback amplifier (10) includes a simple five transistor circuit.

9 Claims, 2 Drawing Sheets

5,451,909

FEEDBACK AMPLIFIER FOR REGULATED CASCODE GAIN ENHANCEMENT

FIELD OF THE INVENTION

The present invention relates to a circuit for enhancing the gain of MOS common-source amplifier stages which circuit utilizes the "regulated cascode" configuration. More particularly, the present invention relates to a circuit for enhancing the gain of MOS common-source amplifier stages which circuit utilizes a simple five-transistor feedback amplifier. The present invention may be used in any linear integrated circuit that needs a high gain amplifier.

BACKGROUND OF THE INVENTION

A technique recently published for enhancing the gain of MOS common-source amplifier stages is the "regulated cascode". To see the development of this technique, first look at a simple common-source stage as shown in FIG. 1. As shown in this drawing, $r_{ds1}$ is the drain-source conductance inherant to device $m_1$, and $R_L$ is the external load resistance. If $r_{ds1}$ were not present, the gain of this amplifier could be made arbitrarily high by selecting arbitrarily large values of $R_L$, since in this case $$V_{out}/V_{in} = -g_{m1} \times R_L$$

But, with $r_{ds1}$ in place, $$V_{out}/V_{in} = -g_{m1} \times (r_{ds1} \| R_L)$$

and the gain would be limited to at most $-g_{m1}r_{ds1}$.

Physically, this is because the small signal voltage across $r_{ds1}$ is the same as the output voltage, and this causes a small signal current to flow through $r_{ds1}$. This diverts some of the current $g_{m1}V_{in}$ from the device transconductance away from $R_L$, reducing the small signal output voltage developed.

A widespread circuit technique for gain enhancement is the cascode configuration shown in FIG. 2. In this circuit, a current $i_{s2}$ is flowing into the source of MOS transistor $m_2$. The impedance to small-signal ground from the source of transistor $m_2$ is approximately $1/g_{m2}$ across $r_{ds1}$, and KCL(Kirchoff's current law) at the source of transistor $m_2$ gives:

$$g_{m1}V_{in}i_{s2} + (i_{s2}/g_{m2})/r_{ds1} = 0$$

but, $$i_{s2} = V_{out}/R_L$$

therefore $$g_{m1}V_{in} + V_{out}/R_L + V_{out}/g_{m2}R_L r_{ds1} = 0$$

or $$V_{out}/V_{in} = -g_{m1}\left[\frac{1}{\frac{1}{R_L} + \frac{1}{g_{m2}R_L r_{ds1}}}\right] = -g_m(R_L \| (g_{m2}R_L)r_{ds1})$$

compared to a simple common-source amplifier, the gain is now only limited by the parallel combination of $R_L$ and $(g_{m2}R_L)r_{ds1}$ instead of $R_L$ and $r_{ds1}$. Therefore, the effective drain-source resistance of transistor $m_1$ has been multiplied by $g_{m2}R_L$ (the "gain" of transistor $m_2$) and much higher gains may be realized by increasing $R_L$. Thus, the basic idea of the cascode circuit is to clamp the drain voltage of amplifier device $m_1$ independent of the output voltage which is the drain of cascode device $m_2$, but still allow whatever drain current generated by device $m_1$, or controlled by the input voltage, to flow through to the load resistance to develop an output voltage. Thus, by clamping the voltage at the drain of device $m_1$, there is substantially zero incremental small signal current flowing through $r_{ds1}$.

In FIG. 3, there is shown a schematic diagram of the "regulated cascode". This circuit is an improved version of the cascode, with the addition of a feedback amplifier. The additional feedback amplifier has voltage gain A, and $V_{D1}$ is its bias voltage that sets the desired level at the drain of transistor $M_1$. Now the impedance to ground that current $i_{s2}$ sees is approximately $1/g_{m2}A$ instead of $1/g_{m2}$. This "regulates" the voltage across $r_{ds1}$ to a smaller small-signal value by a factor of A, resulting in smaller current through $r_{ds1}$. For this stage $V_{out}/V_{in} = -g_{m1}(R_L \| (g_{m2}R_L A)r_{ds1})$. The effective $r_{ds}$ of transistor $m_1$, which is scaled by the effective "gain" of transistor $m_2$, has been increased by a factor A, and the gain of this stage may be raised over that of the simple cascode by increasing resistor $R_L$. Thus, the "regulated cascode" regulates the voltage at the drain of device $m_1$ to a precise figure. It's not a perfect voltage source but it is better by a factor of A over the simple cascode circuit described above.

The current invention is an improved circuit topology for realizing the feedback amplifier in a "regulated cascode". There are two recent publications that describe two different approaches for the "regulated cascode", each with a drawback. A first paper by Sachinger and Guggenbuhl, in IEEE JSSC, Feb. 1990, p. 289, characterizes a regulated cascode where the feedback amplifier 11 as shown in FIG. 4, is a simple MOS common-source gain stage. Transistors $m_1$ and $m_2$, as before are the primary common-source amplifier and cascode devices, and transistor $m_3$ is the feedback amplifier, biased with current source $m_4$.

The drawback to this approach is that the effective value of $V_{D1}$ with this feedback amplifier, or the value of the inverting input for which the amplifier is in its high-gain region, is $V_{Gs3}$(the voltage across the gate and source of transistor $m_3$). This means that the feedback amplifier will regulate the drain voltage of transistor $m_1$ to be at a DC bias level of typically 1.5 volts above the negative supply rail. It is important to preserve the gain-enhancement operation over as wide a swing in the output voltage as possible, and with such a high voltage at the drain of transistor $m_1$, the output voltage need only go below perhaps 2 volts to send transistor $m_2$ into the ohmic region, degrading the stage gain significantly. High gain in this "regulated cascode" circuit depends on both transistors $m_1$ and $m_2$ being in saturation, and transistor $m_1$ will remain in saturation with only $V_{Gs1}$(the voltage from the gate to source of transistor $m_1$)$-V_{T1}$(the threshold voltage of transistor $m_1$), as a bias level at its drain. It need not have as much as $V_{Gs3}$. If the effective $V_{D1}$ of the feedback amplifier can be set at $V_{Gs1}-V_{T1}$ or perhaps 0.5 volts, then the output voltage may swing significantly lower than 2 volts, perhaps 1 volt, before transistor $m_2$ is brought into the ohmic region. This is possible with the feedback amplifier designed by Bult and Geelen, as described in the ISSCC digest 1990, p. 105, and as shown in FIG. 5. In this circuit transistors $m_{10}$ and $m_{11}$ act as a differential pair and are the differential transconductance in the feedback amplifier. Transistors $m_{12}$ and $m_{13}$ act as current sources that supply bias current for the differential pair $m_{10}$ and $m_{11}$ and also supply bias current for folded cascode devices comprising transistors $m_{14}$ and $m_{15}$, transistors $m_{16}$ and $m_{17}$, and transistors $m_{18}$ and $m_{19}$. Transistors $m_{17}$ and $m_{19}$ form diode connected transistors and they take the drain current of transistor $m_{15}$ and mirror it down as a drain current of transistor $m_{18}$. So basically, transistors $m_{16}$, $m_{17}$, $m_{18}$, and $m_{19}$ are one P-channel current mirror. By mirroring the drain current of transistor $m_{15}$ down into the drain of transistor $m_{14}$, a differential to single-ended conversion occurs where the differential transconductance of transistor pair $m_{10}$ and $m_{11}$ make a differential current into the sources of transistors $m_{14}$ and $m_{15}$. The difference of that current is what appears as the current into the node at the junction of the drains of transistors $m_{14}$ and $m_{16}$ which acts as a high impedance because of the stacked cascode devices. Thus, the voltage gain at this output terminal that feeds the gate of transistor $m_2$ will be a gain of 100 for a 1 micron process from the differential voltage input to transistors $m_{10}$ and $m_{11}$ to the single-ended voltage that you use to feed the gate of transistor $m_2$. Transistor $m_{20}$ acts as a tail current source for the differential pair $m_{10}$ and $m_{11}$. Transistors $m_{12}$ and $m_{13}$ are current sources that will both absorb the current coming through transistors $m_{10}$ and $m_{11}$ and also draw additional current through the cascode devices, i.e. transistors $m_{14}$ and $m_{15}$. With this much more elaborate feedback amplifier as shown in FIG. 4, $V_{D1}$ may be set to any desired level, close to the negative supply rail, and the signal swing at $V_{out}$ for which gain enhancement is preserved is greatly increased. However, the drawback of this approach is the large chip area and power required by such an elaborate amplifier.

It is therefore a general object of the present invention to provide a feedback amplifier section for a regulated cascode circuit which saves chip area and requires less power to operate.

It is a more specific object of the present invention to provide a feedback amplifier section for a regulated cascode circuit which requires only 5 transistors to implement.

It is a further object of the present invention to provide a feedback amplifier section for a regulated cascode circuit wherein the value of $V_{D1}$ may be set to any desired level, close to the negative supply rail, and the signal swing at $V_{out}$ for which gain enhancement is preserved is greatly increased.

Other objects of the invention will become apparent to those of ordinary skill in the art having reference to the following specification, in conjunction with the drawings.

SUMMARY OF THE INVENTION

The essence of the feedback circuit 10 of the "regulated cascode" of the present invention is the use of two disimilar device polarities, i.e. a p-channel and an n-channel for devices $m_8$ and $m_9$, respectively to regulate the drain voltage of an n-channel device $m_1$ to generate a small signal current. By measuring the voltage at the drain of device $m_1$ and steering the small signal current generated by devices $m_8$ and $m_9$ in a circular fashion with the mirror devices $m_5$ and $m_6$ a load voltage can be developed across device $m_7$ that can be used to drive cascode device $m_2$. By using the two disimilar device polarities for $m_8$ and $m_9$ the p-channel device $m_8$ senses the drain voltage of device $m_1$ but allows the drain voltage of device $m_1$ go as far down to the negative rail as possible but keeps device $m_1$ in its saturation region. With this simple design for the feedback amplifier section (10) of the "regulated cascode" device savings in chip area and power consumption may be achieved while at the same time providing maximum voltage swing for small signal voltage at the output of said regulated cascode device while keeping said common source and cascode devices in the saturation region.

DETAILED DESCRIPTION OF THE PREFERRED EMBODIMENT

Figure 6:
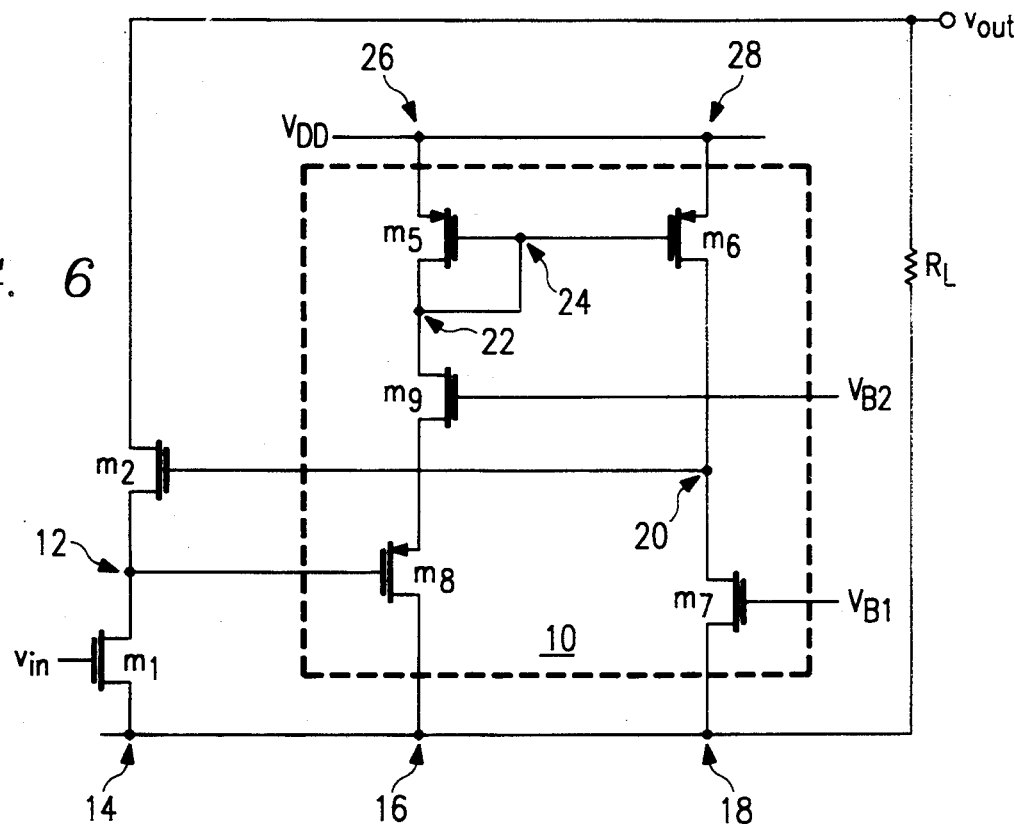
FIG. 6 is a circuit diagram of the "regulated cascode" of the present invention wherein the feedback amplifier section includes a 5-transistor configuration.

In FIG. 6 is depicted a schematic diagram of the "regulated cascode" with improved feedback amplifier section of the present invention. A primary common source amplifier $m_1$ has voltage $V_{in}$ in input to its gate. The drain of device $m_1$ is coupled through node 12 to the source of cascode device $m_2$. The source of n-channel mos transistor $m_1$ is connected to a negative rail at node 14. The output voltage $V_{out}$ is developed across resistor $R_L$ which is connected to the drain of n-channel mos transistor $m_2$ and to the negative rail at node 18. The negative supply rail voltage may typically be at ground potential. The input of feedback amplifier 10 is connected to node 12 and the output at node 20 to the gate of device $m_2$. The input to the feedback amplifier is connected to a p-channel mos transistor $m_8$. The drain of device $m_8$ is connected to the negative supply rail at node 16 and its source is connected to the source of n-channel mos transistor $m_9$. Device $m_9$ receives a bias voltage $V_{B2}$ at its gate and has its drain connected through node 22 to the drain of p-channel mos transistor $m_5$. The gate of device $m_5$ is connected through node 24 to the gate of p-channel mos transistor $m_6$. Node 24 is shorted to node 22. The sources of both devices $m_5$ and $m_6$ are connected to the positive supply rail voltage $V_{DD}$. Voltage $V_{DD}$ may typically be +5 volts. The drain of device $m_6$ is connected through node 20 to the drain of n-channel mos transistor $m_7$. Device $m_7$ receives bias voltage $V_{B1}$ at its gate and has its source connected to the negative rail at node 18.

In operation, the feedback amplifier section transistors $m_8$ and $m_9$ are like a differential pair, in the sense that they are a source follower $m_8$ coupled to a common-gate amplifier $m_9$ at a common source node. But since transistor $m_8$ is P-channel and transistor $m_9$ is N-channel, the bias voltage $V_{B2}$ must be set to the effective voltage level $V_{D1}$(the desired drain voltage of device $m_1$) plus $V_{GS8}$(the voltage across the gate to source of device $m_8$) plus $V_{GS9}$(the voltage across the gate to source of device $m_9$). The output current from the $m_8/m_9$ amplifier stage is mirrored by the combination of transistors $m_5$ and $m_6$, and developes an output voltage across current source device $m_7$. Device $m_7$ is a current source with a fixed bias potential and has a high output impedance. So for incremental changes in the current from the $m_8/m_9$ amplifier state mirrored by transistors $m_5$ and $m_6$, the small signal resistance looking down into the drain of device $m_7$ is very high, so that the small signal current generated in devices $m_8$ and $m_9$ will also be mirrored around and developed across the high resistance of device $m_7$ giving a high gain. This is what produces gain of A in the feedback amplifier circuit. The transconductance of devices $m_8$ and $m_9$ multiplied by the drain to source resistance of device $m_7$, the effective load resistance of this output node 20. Thus, the gain of the main cascode amplifier is improved by the gain of the auxiliary feedback amplifier 10. The essence of the feedback circuit 10 of the "regulated cascode" of the present invention is the use of two disimilar device polarities, i.e. a p-channel and an n-channel for devices $m_8$ and $m_9$, respectively to regulate the drain voltage of an n-channel device to generate a small signal current, by measuring the voltage at the drain of device $m_1$ and steer the small signal current in a circular fashion with the mirror devices $m_5$ and $m_6$ to develop a load voltage across device $m_7$ that can be used to drive device $m_2$. The reason for the disimilar devices is that you want the p-channel device $m_8$ to sense the drain voltage of device $m_1$ but let the drain voltage of device $m_1$ go as far down to the negative rail as possible. This is only possible with a p-channel device and not an n-channel device for device $m_8$.

Bias voltage $V_{B2}$ may be set so that the effective level of voltage $V_{D1}$ is as low as desired to maintain good output voltage swing, but this feedback amplifier 10 may be designed with much less chip area and supply current consumption than the previous design as described in the 'Background Of The Invention'.

Figure 7:
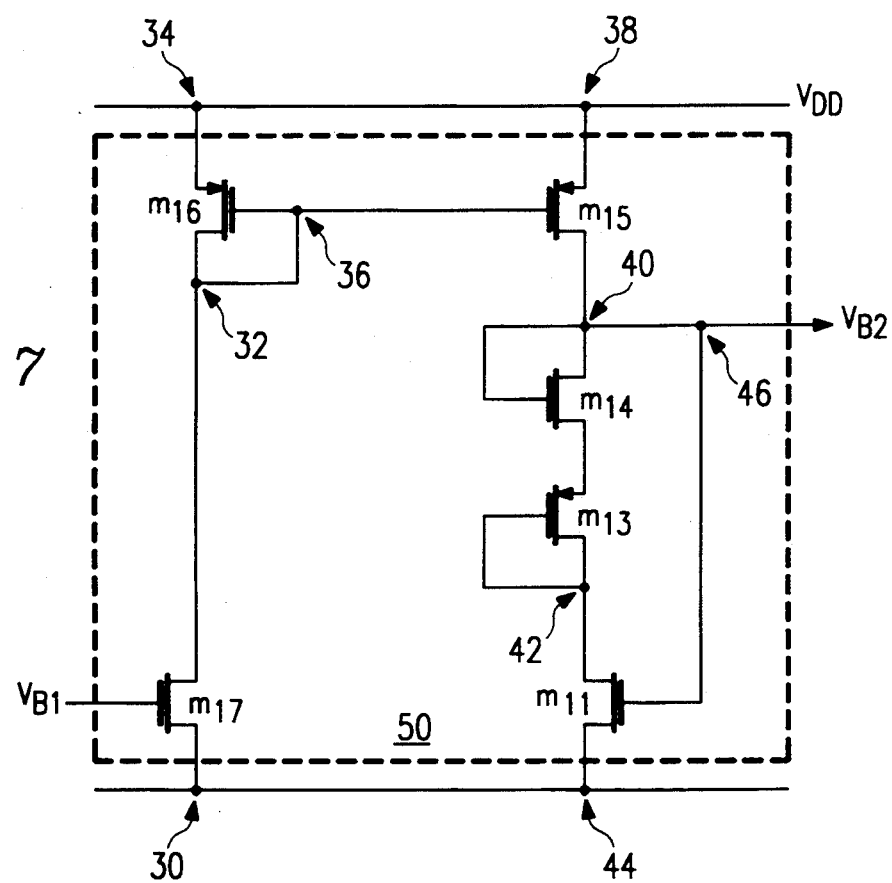
FIG. 7 is a circuit diagram for generating a bias voltage for the feedback amplifier section of the "regulated cascode" of the present invention.

An appropriate bias circuit 50 for generating bias voltage $V_{B2}$ to the feedback amplifier of FIG. 6 is shown in FIG. 7. N-channel mos transistor $m_{17}$ receives a bias voltage $V_{B1}$ at its gate which is the same $V_{B1}$ at the gate of device $m_7$ of FIG. 6. Device $m_{17}$ has its source connected to the negative supply rail at node 30 and its drain connected through node 32 to the drain of p-channel mos device $m_{16}$. Device $m_{16}$ has its gate connected through node 36 to the gate of p-channel mos transistor $m_{15}$. Node 36 is shorted to node 32 and the sources of devices $m_{15}$ and $m_{16}$ are connected to positive supply rail voltage $V_{DD}$ at nodes 34 and 38 respectively. The drain of device $m_{15}$ is connected through node 40 to the drain of n-channel mos transistor $m_{14}$. The gate of device $m_{14}$ is also connected to node 40 and the source of device $m_{14}$ is connected to the source of p-channel mos transistor $m_{13}$. Device $m_{13}$ has its drain connected through node 42 to the drain of n-channel mos transistor $m_{11}$. The gate of device $m_{13}$ is also connected to node 42. The source of device $m_{11}$ is connected to the negative supply rail at node 44 and the gate of device $m_{11}$ is connected to node 46 which is also connected to node 40 at which nodes bias voltage $V_{B2}$ is supplied to the feedback amplifer 10 of FIG. 6.

Figure 1:
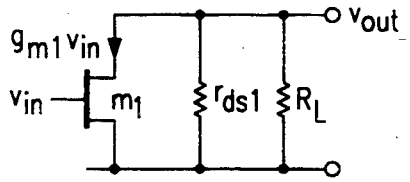
FIG. 1 is a circuit diagram of a simple common-source stage of an MOS amplifier of the prior art.
Figure 2:
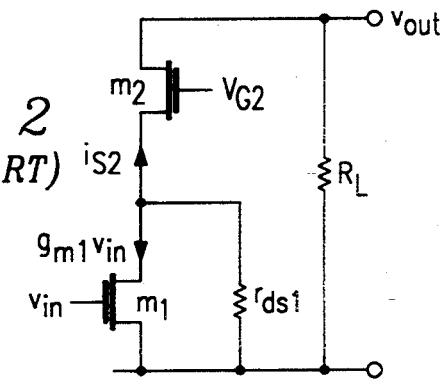
FIG. 2 is a circuit diagram of a "cascode" configuration for an amplifier of the prior art.
Figure 3:
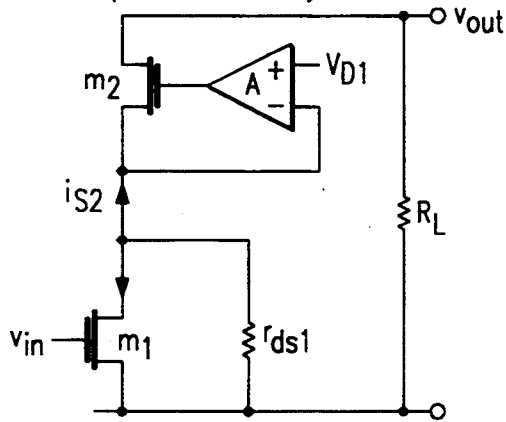
FIG. 3 is a circuit diagram of a "regulated cascode" of the prior art which includes a feedback amplifier.
Figure 4:
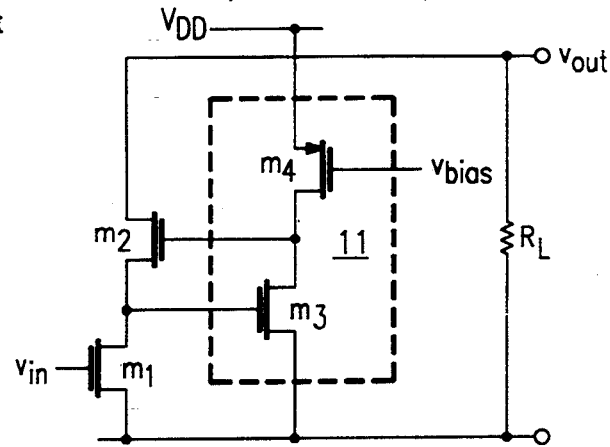
FIGS. 4 and 5 are different embodiments of the "regulated cascode" configurations of the prior art having 2 and 11 transistor feedback amplifier sections, respectively.
Figure 5:
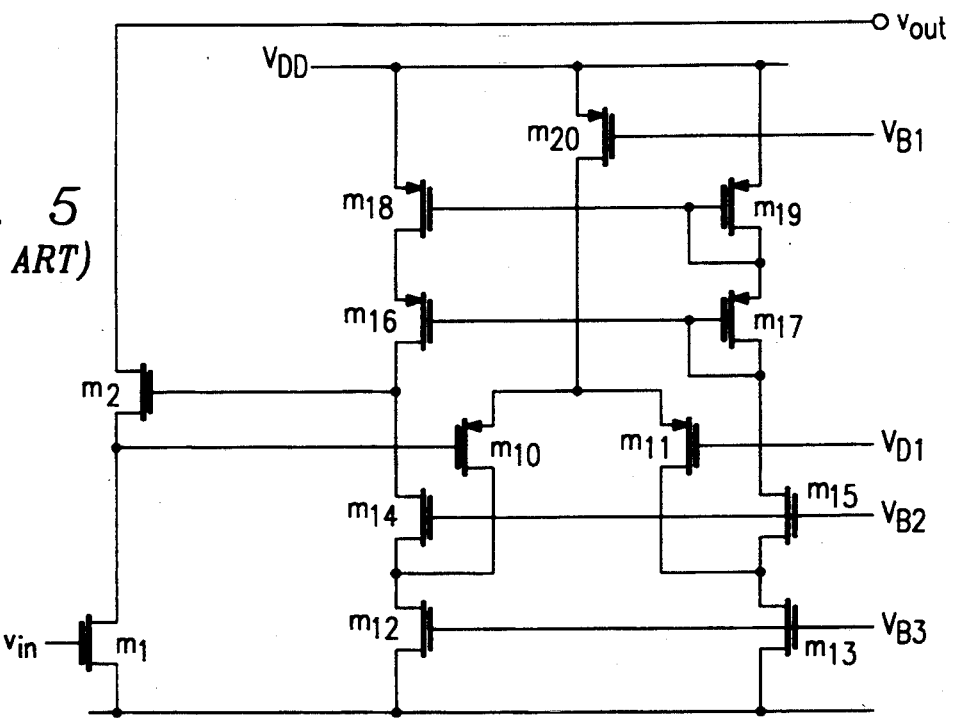

With the prior art "regulated cascode" of Bult shown in FIG. 5, if you want to set 0.7 volts as the target drain voltage of device $m_1$, all you need to do is feed in exactly that voltage at bias input $V_{D1}$. The circuit would settle at a point such that the gain of device $m_2$ would be adjusted by the output of the feedback amp at the gate of $m_2$. The source follower action of device $m_2$ would drag the drain of device $m_1$ up to the point where this drain voltage is equal to 0.7 volts which is equal to the external bias voltage. So, whatever voltage you need at the drain of device $m_1$, just feed in this amount as the bias voltage $V_{B2}$. With the feedback amplifier 10 of the current "regulated cascode" it's much more complicated. You need to feed into the gate of device $m_9$ a bias potential $V_{B2}$ that's $2V_{GS}$ above the desired potential at the drain of device $m_1$. You need the drain voltage of device $m_1$ plus the value of $V_{GS}$ for both devices $m_8$ and $m_9$. You need to feed this bias potential in so that eventually the feedback circuit 10, while driving the gate of device $m_2$, will settle to having the desired voltage at the drain of device $m_1$ and that's the calculation that the bias circuit 50 of FIG. 7 goes through. In this bias circuit 50, device $m_{17}$ matches device $m_7$ of FIG. 6, i.e. the width to length ratio of the device active regions match. Similarly, current mirror devices $m_{15}$ and $m_{16}$ match devices $m_5$ and $m_6$ respectively of the feedback circuit 10. In addition devices $m_{14}$ and $m_{13}$ match devices $m_9$ and $m_8$ respectively of the feedback circuit 10. And finally, device $m_{11}$ matches device $m_1$. This results in the same current flowing through transistors $m_{14}$ and $m_{13}$ as flows in transistors $m_8$ and $m_9$. Transistor $m_{11}$ is a device that operates in the ohmic region, and the size is selected so that the desired level of $V_{D1}$ appears across its drain to source, for example 0.5 volts. Since $V_{GS14}=V_{GS4}$ and $V_{GS3}=V_{GS3}$, this will generate a a voltage $V_{B2}$ that will regulate the drain of transistor $m_1$ in the actual amplifier at the selected value of voltage $V_{D1}$. In the bias circuit 50, it is assumed that the ratios of the various devices have been arranged as described above and that device $m_{11}$ is operating in its ohmic region so that the drain to source voltage of device $m_{11}$ is the desired voltage that you want across the drain to source of device $m_1$. Thus, this is the target potential which will regulate the node 12 at the drain of device $m_1$ in the active amplifier. Bias voltage $V_{B1}$ is the same in both circuits of FIGS. 6 and 7. Device $m_7$ in the active feedback circuit 10 is just a current source device with a fixed bias potential. It acts as a load for the output of the feedback circuit 10. Because device $m_{17}$ is matched to device $m_7$, the same current will flow in the gate of device $m_{17}$ as flows in device my and similarly the same mirror action of devices $m_5$ and $m_6$ as with devices $m_{15}$ and $m_{16}$. And finally devices $m_{14}$ and $m_{13}$, which are connected as two diodes, match the devices $m_9$ and $m_8$ to provide the same current through these devices to the drain of device $m_{11}$. So basically, the bias circuit 50 is set up to have the same current flowing through it as the active amplifier. This is what makes the gate to source voltage of devices $m_{14}$ and $m_{13}$ match the gate to source voltages of devices $m_9$ and $m_8$ in the active circuit, i.e. they are identical devices and they have the same current flowing through them. That's why when the drain voltage of device $m_{11}$ is boosted up by these two $V_{GS}$ values for devices $m_{14}$ and $m_{13}$, the voltages needed to feed into the feedback circuit 10 as bias $V_{B2}$ is automatically calculated. The bias circuit 50 thus acts as an analog computer that figures out what bias voltage is needed in order to clamp the drain of device m₁ to the desired level and achieve proper "regulated cascode" operation with maximum voltage swing.

Typically, on a chip, more than one regulated cascode is built in a high-gain operational amplifier. The bias circuit described above and shown in FIG. 7 may be built once, and used to bias several feedback amplifiers in several regulated cascode configurations. Thus only one bias generator as shown in FIG. 7 is required for all of the enhanced amplifiers.

An alternative embodiment of the present invention would be a "regulated cascode" with enhanced gain wherein the n-channel devices of the feedback amplifier and cascode section become p-channel devices and vice versa. Thus, you would be regulating the source of a p-channel cascode that's up close to the positive supply rail, with an n-channel device, instead of regulating an n-channel device near the negative rail, with a p-channel device. A second alternative embodiment would be to substitute bi-polar devices for the MOS transistors. An npn transistor could be used to regulate the collector of an pnp transistor and vice versa. The remaining device polarities would also have to be changed accordingly. The collectors would be connected in place of the drains; the emitters in place of the sources; and the bases of the bi-polar transistors for the bases of the MOS transistors.

In conclusion, the present invention is an improved way to build the "regulated cascode" with improved feedback amplifier, wherein the feedback amplifier section comprises just five transistors, but the "regulated cascode" will let the drain of m₁ go down to approximately 0.5 volts above the negative rail to fully take advantage of the maximum signal swing possible at $V_{out}$ for which gain enhancement is preserved, thus keeping devices m₁ and m₂ out of the ohmic region. The "regulated cascode" amplifier circuit described is much simpler than the amplifier described in the paper by Bult, discussed in the 'Background Of The Invention' and shown in FIG. 5, but the amplifier circuit of the present invention requires extra devices for the bias generator. However, since only one bias generator is needed for several amplifiers a net savings in chip area is still achieved.

Although the invention has been described in detail herein with reference to its preferred embodiment, it is to be understood that this description is by way of example only, and understood that numerous changes in the details of the invention, will be apparent to, and may be made by, persons of ordinary skill in the art having reference to this description. It is contemplated that such changes and additional embodiments are within the spirit and true scope of the invention as claimed below.

I claim:

1. A regulated cascode circuit with enhanced gain comprising:
    a cascode section comprising:
        a common source MOS transistor of a first polarity and a cascode device wherein the drain of the common-source MOS transistor is coupled to a source of the cascode device, an input to the regulated cascode circuit is applied to the common source MOS transistor and an output of the regulated cascode circuit is developed at a drain of said cascode device across both the common source MOS transistor and cascode device; and
    a feedback amplifier having its input connected to the drain of said common source MOS transistor and its output connected to a gate of said cascode device for driving the cascode device, said feedback amplifier comprising:
        a source follower MOS transistor of a second polarity opposite the polarity of said common source MOS transistor for sensing voltage developed at the drain of said common-source MOS transistor;
        a common gate MOS transistor of said first polarity having its source coupled to a source of said source follower MOS transistor; and
        a steering device coupled to the drain of said common gate device for steering current developed in said source follower MOS transistor and common gate MOS transistor combination to a load device; said load device coupled to said current steering device for developing a voltage to be supplied to the output of said feedback amplifier and to a gate of said cascode device;
    said drain of said common source MOS transistor being clamped to a desired voltage thus providing maximum voltage swing for small signal voltage at the output of said regulated cascode circuit while keeping said common source MOS transistor and cascode devices in a high gain saturation region;
    said feedback amplifier also receives a bias voltage from a bias circuit to establish said desired voltage at the drain of said common source MOS transistor wherein said bias voltage is supplied to the gate of said common gate MOS transistor.

2. The regulated cascode circuit of claim 1 wherein said common source MOS transistor, cascode device, common gate MOS transistor and load device are n-channel and said source follower and current steering device are p-channel MOS transistors.

3. The regulated cascode circuit of claim 1 wherein said common source MOS transistor, cascode device, common gate MOS transistor and load device are p-channel and said source follower and current steering device comprise n-channel MOS transistors.

4. The regulated cascode circuit of claim 1 wherein said load device is a high impedance current source.

5. The regulated cascode circuit of claim 2 wherein said steering device is a current mirror comprising two MOS transistors.

6. The regulated cascode circuit of claim 3 wherein said steering device is a current mirror comprising two MOS transistors.

7. The regulated cascode circuit of claim 2 wherein said separate bias circuit to establish said desired voltage at the drain of said common source MOS transistor automatically establishes a bias voltage which is substantially equal to the desired drain voltage plus the gate to source voltage of both the source follower and common gate MOS transistors.

8. A regulated cascode circuit with enhanced gain comprising:
    a cascode section comprising:
        an n-channel common source MOS transistor; and
        a cascode device wherein a drain of the common source MOS transistor is coupled to a source of the cascode device, an input to the regulated cascode circuit is supplied to a gate of said common source MOS transistor and an output of the regulated cascode circuit is developed at a drain of the cascode device across both the common source MOS transistor and cascode device; and a feedback amplifier having its input connected to the drain of said common source MOS transistor and its output connected to a gate of said cascode device for driving the cascode device, said feedback amplifier comprises:
- a p-channel source follower MOS transistor for sensing the voltage developed at the drain of said n channel common-source MOS transistor;
- an n-channel common gate MOS transistor having its source coupled to a source of said p-channel source follower MOS transistor; and
- a current mirror comprising two p-channel MOS transistors wherein a first transistor of said current mirror is coupled to the drain of said common gate MOS transistor for steering current developed in said source follower MOS transistor and common gate MOS transistor combination to a load device;
- said load device comprises a high impedance current source which is coupled to said current mirror for developing a voltage to be supplied to the output of said feedback amplifier and to the gate of said cascode device;
- said drain of said common source MOS transistor being clamped to a desired voltage thus providing maximum voltage swing for small signal voltage at the output of said regulated cascode circuit while keeping said common source MOS transistor and cascode device in the high gain saturation region;
- said feedback amplifier also receives a bias voltage from a bias circuit to establish said desired voltage at the drain of said common source MOS transistor wherein said bias voltage is supplied to the gate of said common gate MOS transistor.

9. The regulated cascode circuit of claim 8 wherein said p-channel devices are n-channel and said n-channel devices are p-channel.

* * * * *